United States Patent
Maeda et al.

(10) Patent No.: US 6,725,449 B1
(45) Date of Patent: Apr. 20, 2004

(54) SEMICONDUCTOR TEST PROGRAM DEBUGGING APPARATUS

(75) Inventors: Yoshinori Maeda, Tokyo (JP); Hironori Maeda, Tokyo (JP); Tadashi Oda, Tokyo (JP)

(73) Assignee: Advantest Corporation, Tokyo (JP)

( * ) Notice: Subject to any disclaimer, the term of this patent is extended or adjusted under 35 U.S.C. 154(b) by 469 days.

(21) Appl. No.: 09/639,480

(22) Filed: Aug. 15, 2000

(30) Foreign Application Priority Data

Aug. 16, 1999 (JP) .......................................... 11-229628

(51) Int. Cl.⁷ ................................................ G06F 9/44
(52) U.S. Cl. ....................... 717/124; 717/126; 717/138; 703/14; 703/19; 709/217; 709/223; 714/25; 714/18; 714/38
(58) Field of Search ................................ 717/126, 138, 717/124; 714/25, 18, 34, 707, 38, 700; 709/217, 223; 703/14, 19

(56) References Cited

U.S. PATENT DOCUMENTS

| | | | | |
|---|---|---|---|---|
| 4,486,877 A | * | 12/1984 | Turner ......................... | 370/249 |
| 5,548,717 A | * | 8/1996 | Wooldridge et al. ........ | 717/124 |
| 5,701,443 A | * | 12/1997 | Oguma et al. ............... | 703/15 |
| 5,715,387 A | * | 2/1998 | Barnstijn et al. ............ | 714/38 |
| 5,745,767 A | * | 4/1998 | Rosen et al. ................. | 717/124 |
| 5,768,591 A | * | 6/1998 | Robinson .................... | 717/124 |
| 5,838,919 A | * | 11/1998 | Schwaller et al. .......... | 709/224 |
| 5,974,575 A | * | 10/1999 | Fujimoto ..................... | 714/700 |
| 6,128,759 A | * | 10/2000 | Hansen ........................ | 714/738 |
| 6,405,364 B1 | * | 6/2002 | Bowman-Amuah ......... | 717/101 |
| 6,473,794 B1 | * | 10/2002 | Guheen et al. .............. | 709/223 |
| 6,505,338 B1 | * | 1/2003 | Suzuki et al. ................ | 716/18 |
| 6,587,983 B1 | * | 7/2003 | Nakayama ................... | 714/736 |
| 6,594,820 B1 | * | 7/2003 | Ungar .......................... | 717/124 |

OTHER PUBLICATIONS

TITLE: Advanced Simulation output analysis for a single system, author: Alexopoulos, source: ACM, Dec. 1993.*
TITLE: Simulation based performance evaluation of resource allocation algorithms for implementation in the SHF–DAMA satellite network, author: Hobson et al, source: IEEE, 1997.*
TITLE: Simulation of a distributed system for performance modelling, Authors David A. Bennett et al, ACM, 1979.*
TITLE: Testing semiconductor chips: trends and solutions, author: Zorian Y.; IEEE,1999.*

* cited by examiner

*Primary Examiner*—Chameli Chaudhuri Das
(74) *Attorney, Agent, or Firm*—Dellett & Walters

(57) ABSTRACT

A semiconductor test program debugging apparatus is disclosed to which data concerning a packet input to and output from the packet transfer memory device is supplied, and which extracts a part corresponding to the packet from data input to and output from the memory device with response to a test signal generated by a tester simulator and displays the details of the part.

6 Claims, 8 Drawing Sheets

FIG. 4

Pin Define

Pin Name : COL1
Pin Type : I/O : P    Wave Form : DNRZ

Pattern Condition
Pattern Selection : ◆ ALPG Pattern  ◇ DBM Pattern(PPAT)  ☐ RDSM  ☐ RINV Pattern Control : ☐ Swap Mode
◆ PSM
◇ SDM

Setup
◆ Driver  ◇ Comparator  ◇ Data Assignment

Driver Condition
Driver Enable :
■ IOC    DRE : DRE1
        ☐ PDRE
Device Delay Cycle : 0 Cycle
(NOT Tester PC Cycle)

Pin list: COL0, COL1, COL2, COL3, COL4, CMD, ROW0, ROW1, ROW2

Buttons: New, Copy, Apply, Delete, OK, Cancel

Packet Define

COLC-M
COLC-X
ROWA
ROWR

Packet Name : COLC-X
Pin Group : COL    Cycle Count : 8

Configuration :

| Cycle \ Pin | 1st | 2nd | 3rd | 4th | 5th | 6th | 7th | 8th |
|---|---|---|---|---|---|---|---|---|
| COL0 | 1 | 6 | 11 | 16 | 21 | 26 | 31 | 36 |
| COL1 | 2 | 7 | 12 | 17 | 22 | 27 | 32 | 37 |
| COL2 | 3 | 8 | 13 | 18 | 23 | 28 | 33 | 38 |
| COL3 | 4 | 9 | 14 | 19 | 24 | 29 | 34 | 39 |
| COL4 | 5 | 10 | 15 | 20 | 25 | 30 | 35 | 40 |

◆ H : Cycle   V : Pin   ◇ H : Pin   V : Cycle
☐ Horizontal Reverse
☐ Vertical Reverse

[New]
[Apply]
[Delete]

Components :

| START | 6 |
|---|---|
| DC | 1-5 |
| COP | 25, 10, 8, 9 |
| BANK | 33-35, 30 |
| COLUMN | 32, 36-40 |

[OK]   [Cancel]

SEMICONDUCTOR TEST PROGRAM DEBUGGING APPARATUS

BACKGROUND OF THE INVENTION

The present invention relates to a semiconductor test program debugging apparatus which simulates an operation of a semiconductor test apparatus to verify a test program, and in particular to the semiconductor test program debugging apparatus for facilitating verification of a test program for a packet transfer memory device.

Semiconductor test apparatuses have been known which is used for DC tests and functional tests of various semiconductor devices such as logic ICs and semiconductor memory before shipment of them. The test conducted by means of the semiconductor test apparatuses are broadly classified as a functional test and a DC test. A functional test is conducted by providing a predetermined test pattern signal to a device under test (hereinafter referred to "DUT") to determine whether the DUT performs a predetermined operation in response to the test pattern. A DC test is conducted for determining whether the DC characteristics of terminals of a DUT meet predetermined characteristics. The DC tests include, for example, a voltage-application current-measurement test for determining whether a predetermined current is output from a terminal when a known voltage is applied to a DUT and a current-application voltage-measurement test for determining whether a predetermined voltage appears at a terminal when a known current is fed to or took from a DUT. Also in the functional tests, it is often the case where a voltage and currents applied to a DUT are changed for testing: for example, a voltage lower than a predetermined voltage is set as a high-level voltage (for example, 4 volts, which is lower than normal 5 volts, is set as the high-level voltage) or a voltage higher than a predetermined voltage is set as low-level voltage (for example, 0.5 volts, which is higher than normal 0 volts is set as the low-level voltage).

Because the details of a functional or DC test, such as what test items are conducted under what conditions, are pre-specified by a semiconductor test program, various tests can be conducted on a DUT by executing the semiconductor test program. The semiconductor test program must control wide variety of operations such as test item and condition setting, execution of a test, and judgement of the test result, and therefore consists of an enormous number of steps. If the type or logic of a DUT is changed, various changes must be made to the semiconductor test program accordingly. When a semiconductor test program is newly written or modified, the program must be evaluated to see if the program itself operates properly or not.

Conventionally a semiconductor test program is evaluated by executing the program with the use of real semiconductor test apparatuses. However, it is not desirable to use the real semiconductor test apparatuses to evaluate to see if the semiconductor test program operates properly or not because the number of installed semiconductor test apparatuses is small due to their high price and the production line of the semiconductor testing is halted by the evaluation. To address this problem, in these days, rather than using a real semiconductor test apparatus for the evaluation of a semiconductor test program, the operation of the semiconductor test apparatus is simulated by means of a general purpose computer such as a workstation to determine whether a semiconductor test program operates or not.

However, when a semiconductor test program for a new type of device called a packet transfer memory device is verified by configuring and using a virtual semiconductor test apparatus as heretofore, problems arise as described bellow. Unlike conventional memory devices, the packet transfer memory device does not have predetermined address pins or data pins, instead, it extracts an address and data based on packet data inputted to a predetermined number of pins and reads/writes data based on the extracted address and data.

The packet transfer memory device therefore cannot be tested by simply applying data generated according to a semiconductor test program to the pins of the device like the address pins and data pins of conventional memory devices. A user must write a semiconductor test program while taking care to ensure that data is generated according to the configuration of packet data specific to the packet transfer memory device. In addition, it is required to be verified that data generated by the written semiconductor test program is corresponding to the packet data specific to the packet transfer memory device. Heretofore, this verification is manually performed by the user printing or displaying on a CRT the data output by the execution of the semiconductor test program.

SUMMARY OF THE INVENTION

The present invention is made in view of the above-mentioned problems and it is an object of the present invention to provide a semiconductor test program debugging apparatus which allows a semiconductor test program for a semiconductor device, such as a packet transfer memory device which operates based on packet data to be easily debugged.

The semiconductor test program debugging apparatus of the present invention comprises tester simulation unit for simulating the operation of a semiconductor test apparatus by generating a test signal in a simulative manner based on a test program provided for a packet transfer memory device, data supply unit for supplying data concerning a packet input to and output from the packet transfer memory device, and packet extraction and display unit for, based on the data supplied by the data supply unit, extracting a part corresponding to the packet from the test signal generated by the tester simulation unit and displaying the content thereof.

The tester simulation unit runs the test program to be debugged under the operating system of a general-purpose computer and constitutes a semiconductor test apparatus in a simulative manner. The data supply unit supplies, as the data concerning a packet, information about a packet data configuration specific to a packet transfer memory device and pins through which the packet is input or output. The packet extraction and display unit extracts, based on data concerning the packet, a part corresponding to the packet from data which is a test signal output from the test simulation unit and is input/output through a predetermined pin, and displays the detailed configuration of the packet which correspond to the part. The user can debug the semiconductor test program by verifying whether the displayed details of the packet match desired details or not.

The data supply unit above-mentioned preferably supplies information about predefined pin conditions of the packet transfer memory device, a pin group making up the packet, the configuration of the packet, and the starting position of the packet as the data concerning to the packet. This data is prescribed data concerning the packet to be supplied by the data supply unit. By using this detailed data, the part corresponding to the packet can be easily extracted from a test signal generated by the tester simulation unit.

The data supply unit above-mentioned preferably accepts various inputs through a graphical user interface (GUI) screen to generate the data concerning the packet. Because the user can input information such as pin conditions by simply selecting or inputting appropriate information through a predetermined definition screen, the labor for inputting data about the packet can be reduced.

The packet extraction and display unit above-mentioned preferably displays the part corresponding to the packet in a timing chart image using step values of the simulation operation by the tester simulation unit for the time axis. This timing chart image specifies how the packet extraction and display unit displays packets. This allows the user to easily know the position of a packet in data sequentially input to and output from the packet transfer memory device.

The packet extraction and display unit above-mentioned preferably displays output values during each cycle for each pin in a way that components contained in the packet can easily be identified when instructed to display details of the part corresponding to the packet displayed in the timing chart image. This allows the user to easily know the specific details of the packet.

The packet extraction and display unit above-mentioned preferably displays a packet component display area in which the data configuration of each component is displayed in the same display screen as the packet data configuration display area in which output values are displayed. This allows the user to easily know the specific details of the data for each pin corresponding to the packet.

BRIEF DESCRIPTION OF THE DRAWINGS

FIG. 4 shows an example of a display screen concerning the setup of a driver condition in a pin define dialog.

FIG. 5 shows an example of a display screen concerning a pin group define dialog.

FIG. 6 shows an example of a display screen concerning a packet define dialog.

DESCRIPTION OF THE PREFERRED EMBODIMENT

Figure 2:
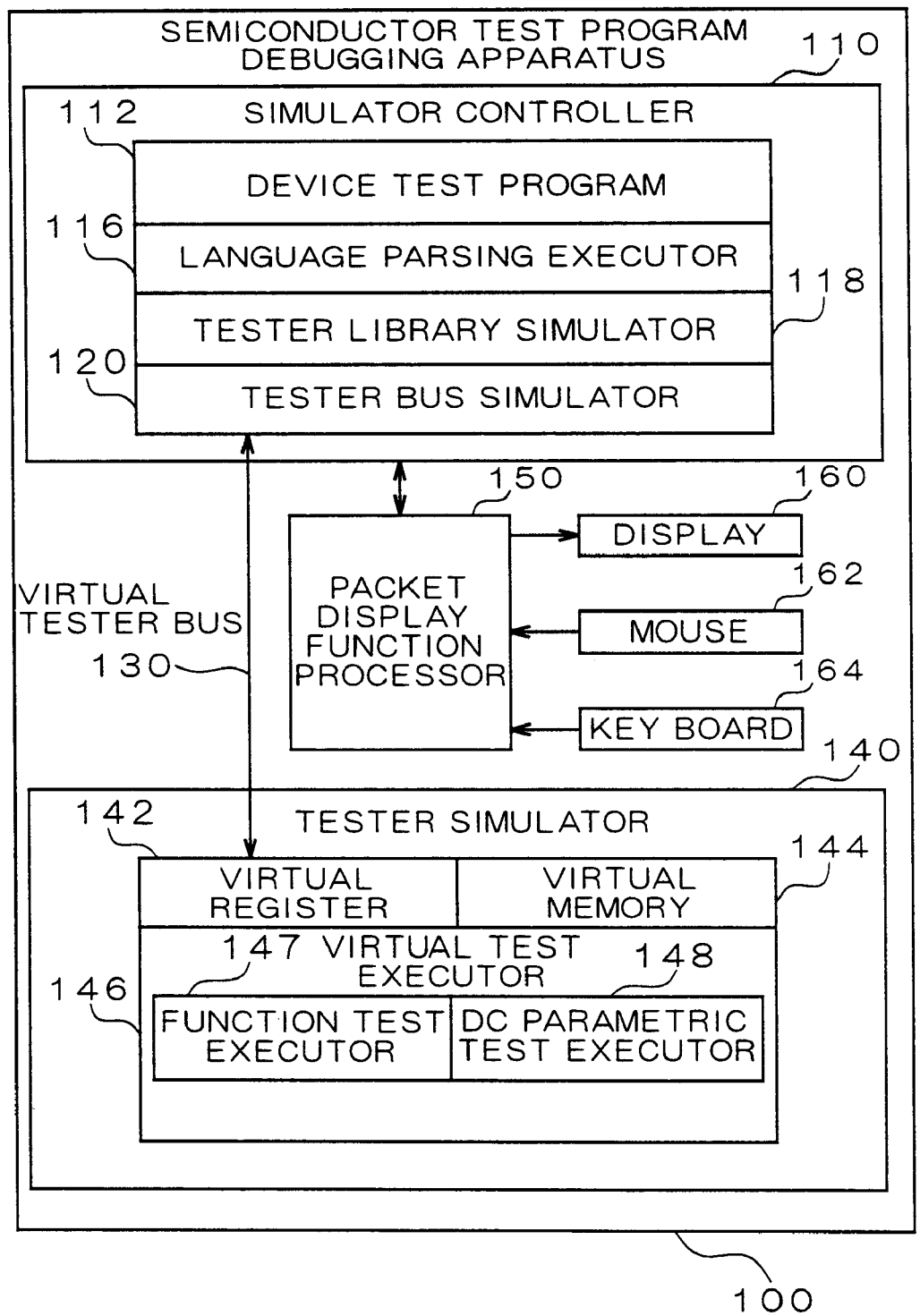
FIG. 2 shows the whole configuration of a semiconductor test program debugging apparatus according to the present invention.

An embodiment of a semiconductor test program debugging apparatus according to the present invention will be described below with reference to the accompanying drawings. FIG. 2 shows the whole configuration of the semiconductor test program debugging apparatus. The debugging apparatus 100 verifies whether a semiconductor test program operates properly by simulating a semiconductor test apparatus, and is implemented with a general-purpose computer such as a workstation.

Because the debugging apparatus 100 according to the embodiment simulates the actual semiconductor test apparatus, the general configuration of the simulated semiconductor test apparatus will be described before the detailed description of the debugging apparatus 100 is provided.

Figure 3:
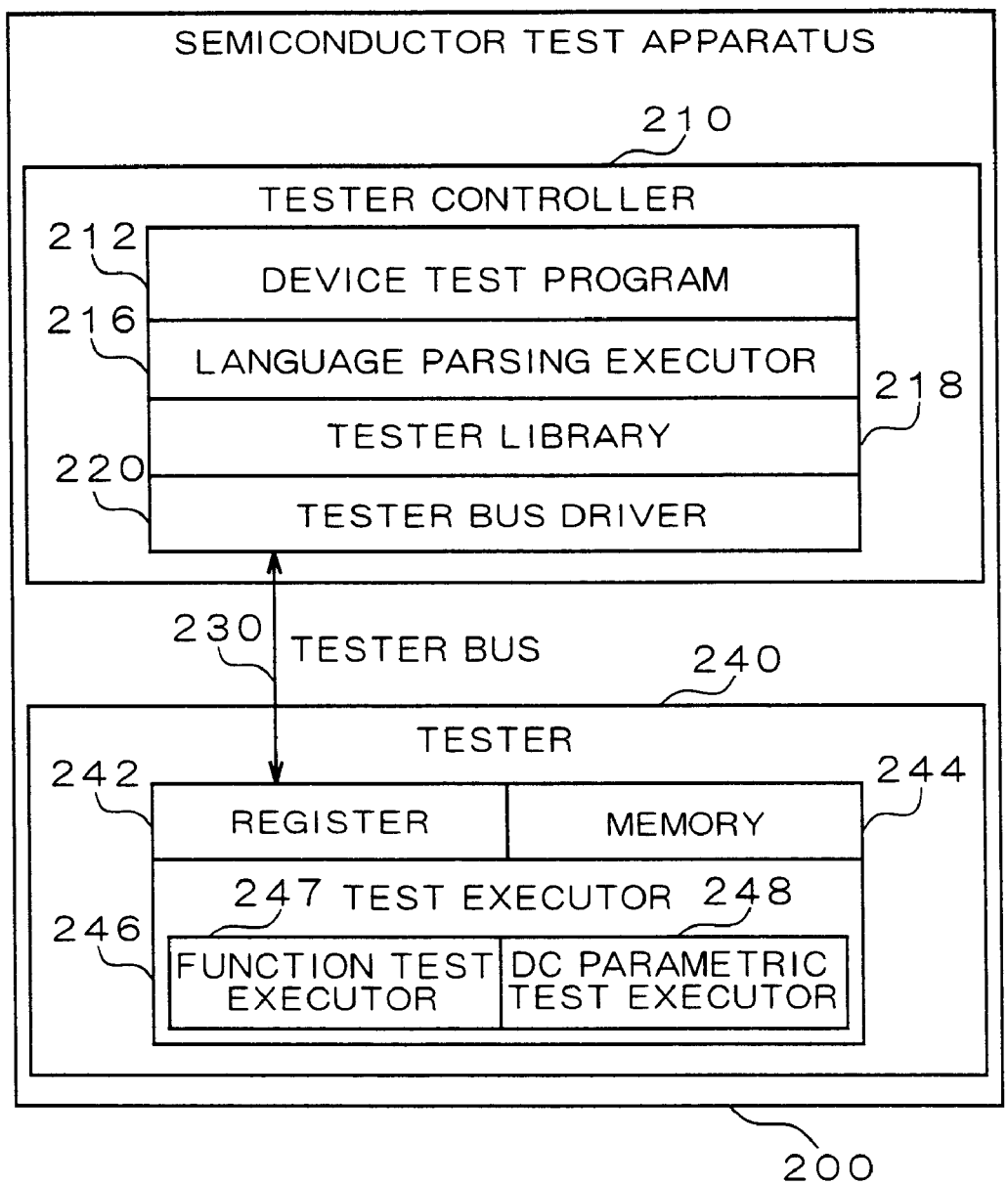
FIG. 3 shows the whole configuration of an actual semiconductor test apparatus.

FIG. 3 shows the whole configuration of an actual semiconductor test apparatus. In FIG. 3, the semiconductor test apparatus 200 is depicted. The semiconductor test apparatus 200 performs various DC tests (DC parametric tests) and functional tests on a DUT. The semiconductor test apparatus 200 comprises a tester controller 210, a tester bus 230, a tester 240, and a socket section (not shown) for mounting the DUT.

The tester controller 210 controls the operation of the tester 240 and comprises a semiconductor test program (device test program) 212, a language parsing executor 216, a tester library 218, and a tester bus driver 220.

The device test program 212 describes what tests are conducted on a DUT by a user using a semiconductor test apparatus 200 and their procedures and methods. The device test program 212 contains a test plan program for setting test conditions and other values to control a test sequence and a pattern program for setting patterns generated by an ALPG (Algorithmic Pattern Generator). Typically the device test program is developed and written by the user of the semiconductor test apparatus 200. The user therefore can verify whether the device test program 212 written by the user operates properly by using the debugging apparatus 100 of the embodiment, thereby enhancing the perfectness of the device test program without using the actual semiconductor test apparatus 200. The language parsing executor 216 parses the device test program 212 and plays a dominant role in ensuring that the semiconductor test device 200 operates exactly according to the device test program 212.

The tester library 218 converts instructions of the device test program 212 that have been obtained by parsing by the language parsing executor 216 into register-level instructions (data concerning data write instruction to a register 242 and data read instruction from the register 242, which will be described below) to generate and set data required for the operation of the semiconductor test apparatus 200, and directs the tester 240 to perform a measurement operation. The tester bus driver 220 transfers the data generated by the tester library 218 to the register 242 in the tester 240 via the tester bus 230.

The tester 240 performs various tests on the DUT based on the data received from the tester controller 210 via the tester bus 230. The tester 240 comprises the register 242, memory 244, and a test executor 246. The register 242 stores data provided from the tester library 218 via the tester bus 230. The data stored in the register 242 is output to the test executor 246 directly or through the memory 244.

The test executor 246 includes a functional test executor 247 and a DC parametric test executor 248. The test executor 246 performs a functional test or a DC parametric test on the DUT based on the data stored in the register 242 and the memory 244 provided from the tester library 218.

The debugging apparatus 100 shown in FIG. 2 simulates the entire operation of the semiconductor test apparatus 200 described above. Thus, whether the operation of device test program 112 agrees with the operation intended by the user can be determined by executing a device test program 112 written for the semiconductor test apparatus 200 by means of the debugging apparatus 100 shown in FIG. 2. The configuration of the debugging apparatus 100 according to the embodiment will be described below.

A simulator controller 110 shown in FIG. 2 comprises the device test program 112, a language parsing executor 116, a tester library simulator 118, and a tester bus simulator 120. The simulator controller 110 controls the operation of a tester simulator 140 and performs the essentially the same operation as that of the tester controller 210 in the semiconductor test apparatus 200 shown in FIG. 2.

The device test program 112 describes what tests are conducted on a DUT using a semiconductor test apparatus 200 and their procedures and methods and is the program to be debugged by the debugging apparatus 100. Therefore the device test program 212 shown in FIG. 3 is ported as the device test program 112 and the device test program 112 is configured so as to perform operations similar to those of the device test program 212. Similarly, the language parsing executor 216 and the test library 218 shown in FIG. 3 are ported as the language parsing executor 116 and the tester library simulator 118 and they are configured so as to operate similarly. The tester bus simulator 120 drives a virtual tester bus 130 connecting virtually the simulator controller 110 with the test simulator 140 to control the communication of data between the tester library simulator 118 and the tester simulator 140 through the virtual tester bus 130.

The tester simulator 140 is a software implementation of the operation of the tester 240 shown in FIG. 3 and performs simulated test on a virtual device according to the operation instructions from the tester library simulator 118 in the simulator controller 110. The tester simulator 140 comprises a virtual register 142, virtual memory 144, and a virtual test executor 146. The virtual register 142 stores data from the tester library simulator 118. The data stored in the virtual register 142 is provided directly or through the virtual memory 144 to the virtual test executor 146.

The virtual test executor 146 includes a functional test executor 147 and a DC parametric test executor 148. The virtual test executor 146 outputs a predetermined data to be applied to the virtual device based on the data stored in the virtual register 142 provided from the tester library simulator 118 for conducting a functional test by the functional test executor 147 or a DC parametric test by the DC parametric test executor 148.

For a common memory device, the verification of proper operation of the device test program 112 can be performed in this way. For a packet transfer memory device, however, verification should be made beforehand as to whether the configuration of packet data generated by the device test program 112 matches the configuration specific to the packet transfer memory device.

A packet display function processor 150 shown in FIG. 2 sets parameters concerning the structure of the packet data specific to a packet transfer memory device and performs a process for retrieving a part corresponding to the packet from a vast amount of data obtained by the execution of predetermined debugging process and displaying it in a predetermined format. Connected to the packet display function processor 150 is a display 160 for displaying the result of the process and providing a GUI with the user, a mouse 162 as a pointing device used for pointing any position on the screen of the display 160, and a keyboard 164 used by the user for inputting data such as text data.

Figure 1:
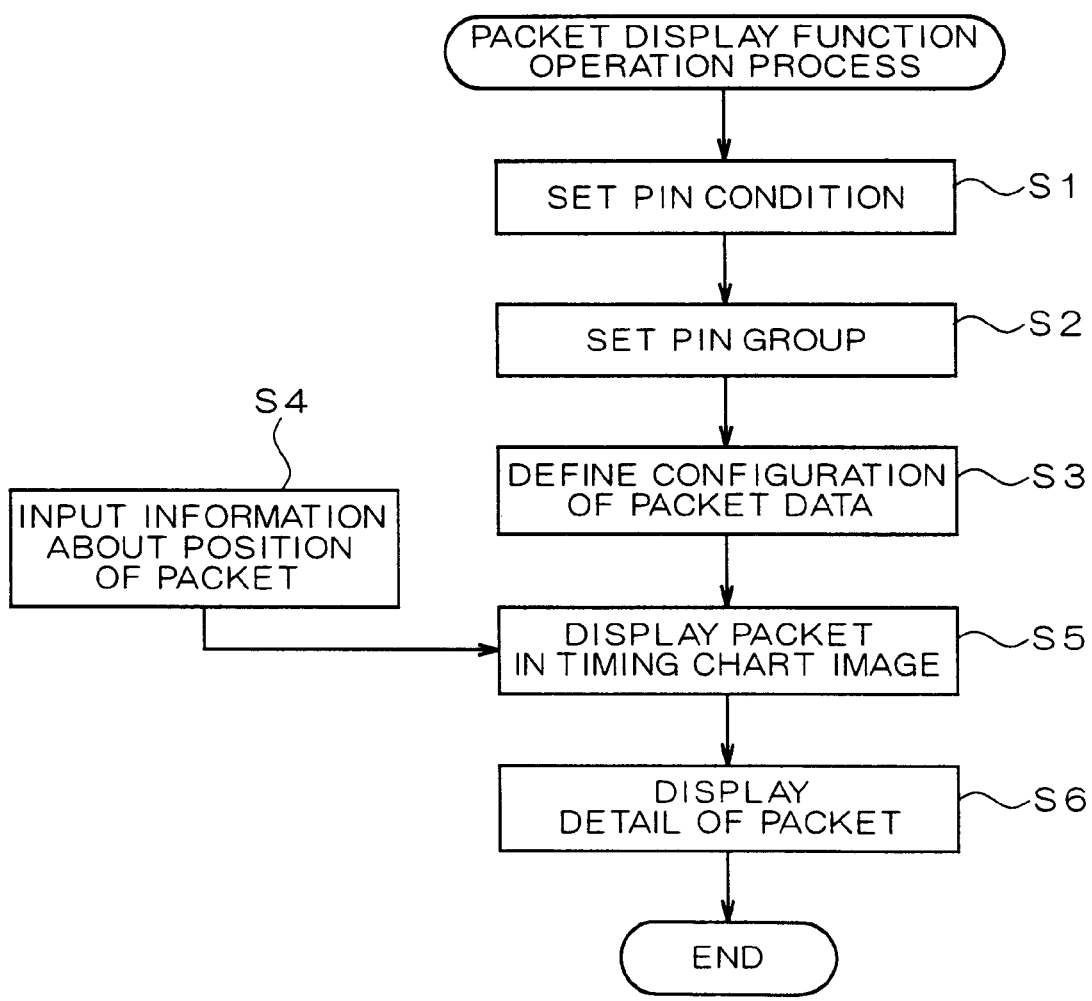
FIG. 1 shows one example of a packet display function operating process.

FIG. 1 shows an example of a packet display function process for facilitating verification whether packet data generated by the execution of the device test program 112 corresponds to data for the packet transfer memory device. The packet display function process comprises process steps from steps S1 to S4 performed by the user with the GUI to set parameters concerning the configuration of packet data specific to the packet transfer memory device and process steps S5, S6 of displaying the position of a packet and the details of the packet in response to the results of actual debugging by the tester simulator 140 in the debugging apparatus 100. Operations from step S1 to S4 are accomplished by using the packet display function processor 160, the mouse 162, and the keyboard 164 to input data in a predetermined area within various Define dialogs (the specific examples of which will be described below) displayed and to select one of selection buttons as the occasion demand. Operations at steps S5, S6 are accomplished by using the packet display function processor 160, the mouse 162, and keyboard 164 to display the position of a packet and the details of the packet in response to the results of debugging performed by the test simulator 140 under the control of the simulator controller 110.

At step S1, the user sets the pin condition of a packet transfer memory device by following a Pin Define dialog shown in FIG. 4. In the Pin Define dialog, a driver condition, a comparator condition, and an I/O common pin can be set up, DNRZ, /DNRZ can be specified, the ALPG or DBM (Data Buffer Memory) pattern can be selected, PSM or SDM can be specified, and other settings can be made.

FIG. 4 shows an example of a display screen concerning the setting of a driver condition in the Pin Define dialog. At the top of the Pin Define dialog is a title bar on which the title "Pin Define" is displayed. The list of pin names is displayed in the left-hand area of this dialog for allowing the user to display and select a pin name registered. Pin names "COL0", "COL1", "COL2" . . . "ROW1", and "ROW2" are displayed and the pin name "COL1" is selected in FIG. 4. Buttons "New", "Copy", "Apply", and "Delete" displayed below this pin name list are pin name list manipulation buttons. The "New" button is used for editing a new pin condition. The "Copy" button is used for applying the pin condition of a selected pin from the pin name list to a new pin or another pin. The "Apply" button is used for registering each content of setting items within the pin condition setting display area to the pin name list. The "Delete" button is used for deleting a selected pin from the pin name list.

To the right of the pin name list and the pin name list manipulation button is a pin condition setting display area for setting and displaying pin conditions. The pin condition setting display area includes a pin name display area titled "Pin Name", a pin type selection menu titled "Pin Type", a waveform mode selection menu titled "Wave Form", a pattern condition selection area titled "Pattern condition", a setting item selection area "Setup", and a condition setting area titled "Driver Condition".

A pin name is displayed in the pin name display area "Pin Name". The pin type selection menu "Pin Type" is a menu from which a pin type can be selected by the user. Clicking on its menu window causes a menu option to pop up, such as "I/O:P" indicating an I/O pin, "DR:PD" indicating a driver pin, and "CP:PC" indicating a comparator pin. The I/O pin is selected in FIG. 4. The waveform mode selection menu "Wave Form" is a menu from which a waveform mode can be selected. Clicking on its menu window causes a menu option to pop up, such as "DNRZ", "/DNRZ", "others", and "/others". "/DNRZ" represents the inverse pattern of the "DNRZ" pattern, "others" represents patterns other than "DNRZ" pattern, and "/others" represents their inverse pattern. "DNRZ" is selected in FIG. 4.

In the pattern condition selection area "Pattern Condition", a pattern to be applied to a pin and a connection condition for the pin can be selected. The pattern condition selection area consists of a pattern selection area "Pattern Selection" in which a pattern to be applied to the pin can be selected and a pattern control area "Pattern Control" in which a connection condition for the pin can be selected. The pattern selection area includes "ALPG Pattern" button for specifying the use of a pattern generated by the ALPG as the pattern to be applied to the pin and "DBM Pattern" button for specifying the use of a DBM pattern as the pattern to be applied to the pin. The pattern control area includes "Swap Mode", and "RDSM", "RINV" buttons for selecting a connection condition for the pin. The "Swap Mode" button includes "PSM" and "SDM" buttons. Detailed description of these buttons for pin connection conditions are omitted here.

The setting item selection area "Setup" is used for selecting an item from Driver, Comparator, and Data Assignment for which a condition is set. The setting item selection area includes a driver selection button, "Driver", for setting driver conditions, a comparator selection button, "Comparator", for setting comparator conditions, and a data assignment selection button, "Data assignment", for assigning data to the ALPG or DBM pattern. When one of these buttons is selected, a condition setting area corresponding to the selected button is displayed. In FIG. 4, the driver condition setting area "Driver Condition" is displayed after the driver selection button, "Driver" is selected. Herein, omitted are examples of a display in the case where a comparator selection button "Comparator" and a data assignment selection button "Data Assignment" are selected.

The driver condition setting area, "Driver Condition", consists of an IOC selection button, "IOC", a DRE selection menu, "DRE", a PDRE selection button, "PDRE", and a delay cycle count setting area, "Device Delay Cycle". The IOC selection button, "IOC" is used to select ON/OFF control of the driver. The DRE selection menu, "DRE", is used when a DRE signal from the ALPG is used as the condition (DRE pattern) for indicating a driver pattern to the I/O pin. Clicking on its menu window causes two menu options to pop up: "DRE1" specifies that a DRE1 signal output from the ALPG is used and "DRE2" specifies that a DRE2 signal output from the ALPG is used. The PDRE selection button, "PDRE" is used to specify that DRE data from the DBM is used as the DRE pattern. The delay cycle count setting area, "Device Delay Cycle" is used for setting cycles for delaying the driver and DRE patterns.

The "OK" button displayed at the bottom of the Pin Define dialog is used to settle the setting contents in the dialog, then close the dialog. The "Cancel" button is used to close the dialog without settling the setting contents in the dialog.

Figure 5:
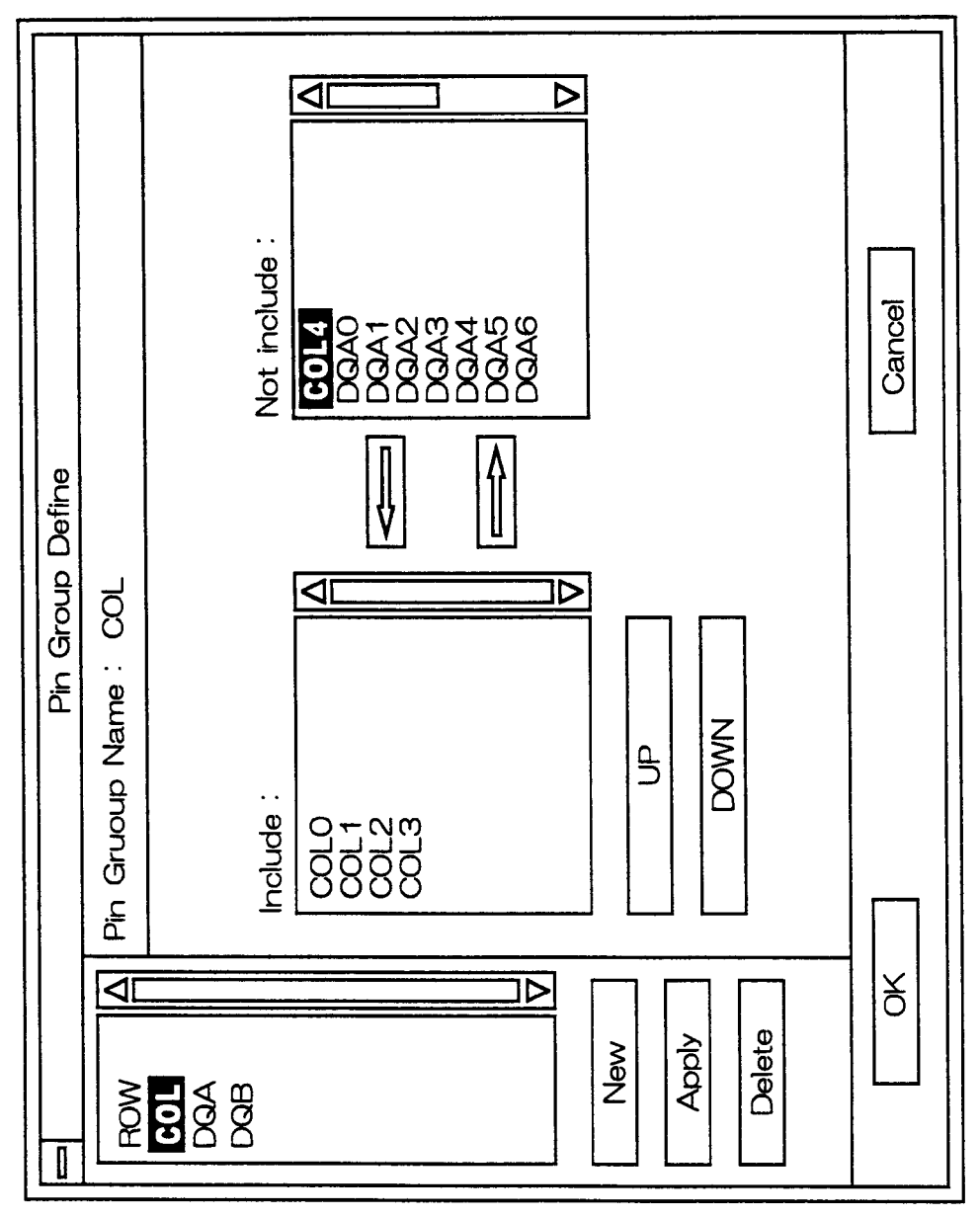

At step S2, the user sets up a pin group that makes up a packet by following a Pin Group Define dialog shown in FIG. 5. In the Pin Group Define dialog, a pin group is defined from the pins defined in the Pin Define dialog shown in FIG. 4 and settings such as arrangement of the pins in a pin group (bit position) are specified.

FIG. 5 shows an example of a display screen relating to the Pin Group Define dialog. At the top of the Pin Group Define dialog is a title bar on which the title "Pin Group Define" is displayed. In the left-hand area of the Figure is an area where the list of defined pin group names "ROW", "COL", "DQA", and "DQB" is displayed in which a pin group can be selected. Buttons "New", "Apply", and "Delete" displayed below the pin group name list are pin group name list manipulation buttons. The "New" button is used for editing a new pin group. The "Apply" button is used for registering setting contents within the pin group setting display area to the pin group name list. The "Delete" button is used for deleting a selected pin group from the pin group name list. A pin group name, "COL" is selected and highlighted in reverse video in FIG. 5.

To the right of the pin group name list and pin name list manipulation buttons is a pin group setting display area where settings for a pin group are defined and displayed. The pin group setting display area consists of a pin group name display area titled "Pin Group Name", a first pin list titled "Include", and a second pin list titled "Not include". A pin group name is displayed in the pin group name display area "Pin Group Name". Pins included in the pin group are displayed and selected in the first pin list "Include". Pins which are not included in the pin group are displayed and selected in the second pin list "Not include". Between the first pin list "Include" and the second pin list "Not include" are two buttons for changing the list to which a pin belongs. One button on which a left arrow is indicated is used to move a selected pin in the second pin list "Not include" to the first pin list. The other button on which a right arrow is indicated is used to move a selected pin in the first pin list to the second list. In FIG. 5, assumption is that the pin name "COL4" is selected and highlighted in reverse video in the second pin list "Not include" and is included in the first pin list by operating the right arrow button. The up button "UP" and the down button "DOWN" below the first pin list are used for moving the position of a selected pin in the first pin list up and down. The "OK" button displayed at the bottom of the Pin Group Define dialog is used to settle the setting contents in the dialog, then close the dialog. The "Cancel" button is used to close the dialog without settling the setting contents in the dialog.

At step S3, the user defines a configuration of the packet data by following a Packet Define dialog shown in FIG. 6. In the Packet Define dialog, a packet data is configured for the pin group defined in the Pin Group Define dialog shown in FIG. 5.

FIG. 6 shows an example of a display relating to the Packet Define dialog. At the top of the Packet Define dialog is a title bar on which "Packet Define" is displayed. On the left-hand side in the figure, the area in which "COLC-M", "COLC-X", "ROWA" and "ROWA" are displayed is an area in which the list of packet names for displaying and selecting the registered packet names is displayed. The packet name "COLC-X" is selected in FIG. 6.

To the right of the packet name list and the packet name list manipulation button is a packet setting display area for defining and displaying a packet data configuration. The packet setting display area consists of a packet name display area titled "Packet Name", a pin group display area titled "Pin Group", a cycle display area titled "Cycle Count", a packet configuration display area titled "Configuration", and a component setting display area titled "Components".

A packet name is displayed in the packet name display area "Packet Name". A pin group name constituting a packet is displayed in the pin group display area "Pin Group". The cycle count of the packet is displayed in the cycle display area "Cycle Count". The pin group "COL", which is set in the FIG. 5 is displayed in FIG. 6.

The configuration of the packet is displayed in the packet configuration display area "Configuration", which includes an axis information display area in which "Cycle", "Pin" are displayed, a row item display area in which "COL0" to "COL4" are displayed, a column item display area in which "1st" to "8th" are displayed, a packet matrix ID display area in which a position in the matrix is indicated by a number from 1 to 40, axis reverse buttons labeled with "H:Cycle V:Pin", "H:Pin V:Cycle", a horizontal axis reverse button labeled with "Horizontal Reverse", and a vertical axis reverse button labeled with "Vertical Reverse".

The axis information display area indicates which of the pin name and the cycle number are the horizontal axis (column item) and the vertical axis (row item) in the packet configuration display area "Configuration" correspond to. The item name (pin name or cycle number) of each row and each column is displayed in the row item display area and the column item display area. Numbers (packet matrix IDs) to be assigned to bits making up the packet are displayed in the packet matrix ID display area. The axis reverse buttons are used for switching items between horizontal and vertical axes. One button labeled with "H:Cycle V:Pin" is a first axis setting button and, when selected, cycle counts are displayed along the horizontal axis and pin names are displayed along the vertical axis in the packet configuration display area. In FIG. 6, the first axis setting button is selected. The other button labeled with "H:Pin V:Cycle" is a second axis setting button and, when selected, pin names are displayed along the horizontal axis and cycle counts are displayed along the vertical axis in the packet configuration display area. The horizontal reverse button and vertical reverse button are used for reversing the order of the items along the horizontal and vertical axes, respectively.

Components contained in the packet are displayed or set in the component setting display area "Components". The term "component" herein refers to a set of one or more bits contained in a packet. The components are defined according to the configuration of the DUT, which is a packet transfer memory device. The component setting display area "Components" consists of component name setting area labeled with "START", "DC", and "COP" and component bit setting display area indicated with the numbers displayed to the right of the component name setting area. Component names input by the user are set or displayed in the component name setting area, and values corresponding to matrix IDs of bits constituting a component are input in the component bit setting display area. In FIG. 6, "6" is set as a matrix ID in the component name "START", "1–5" are set in the area "DC", "25, 10, 8, 9" are set in the area "COP", "33–35, 30" are set in the area "BANK", and "32, 36–40" are set in the area "COLUMN". Here, "1–5" represents "1, 2, 3, 4, 5", "33–35" represents "33, 34, 35", and "36–40" represents "36, 37, 38, 39, 40". In this respect, "5–1" represents "5, 4, 3, 2, 1".

The buttons labeled with "New", "Apply", and "Delete" displayed below the packet name list are packet name list manipulation button. The "New" button is used to add a new packet. The "Apply" button is used for applying the setting contents in the packet setting display area to the packet name list. The "Delete" button is used for deleting a selected packet from the packet name list. The "OK" button displayed at the bottom of the Packet Define dialog is used to settle the setting contents in the dialog, then close the dialog. The "Cancel" button is used to close the dialog without settling the setting contents.

At step S4, the user inputs information about the start position of the packet into the pattern program, separately from the process from steps S1 to S3. That is, the user who wrote a pattern program knows the start position of a packet in the pattern program and therefore inserts a PKT instruction as the start position information of the packet in the pattern program. For example, when the packet name "COLC-X" is defined in the Packet Define dialog in FIG. 6, the user inserts a description such as "PKT (COLC-X, C0)" as the PKT instruction into the pattern program.

Figure 7:
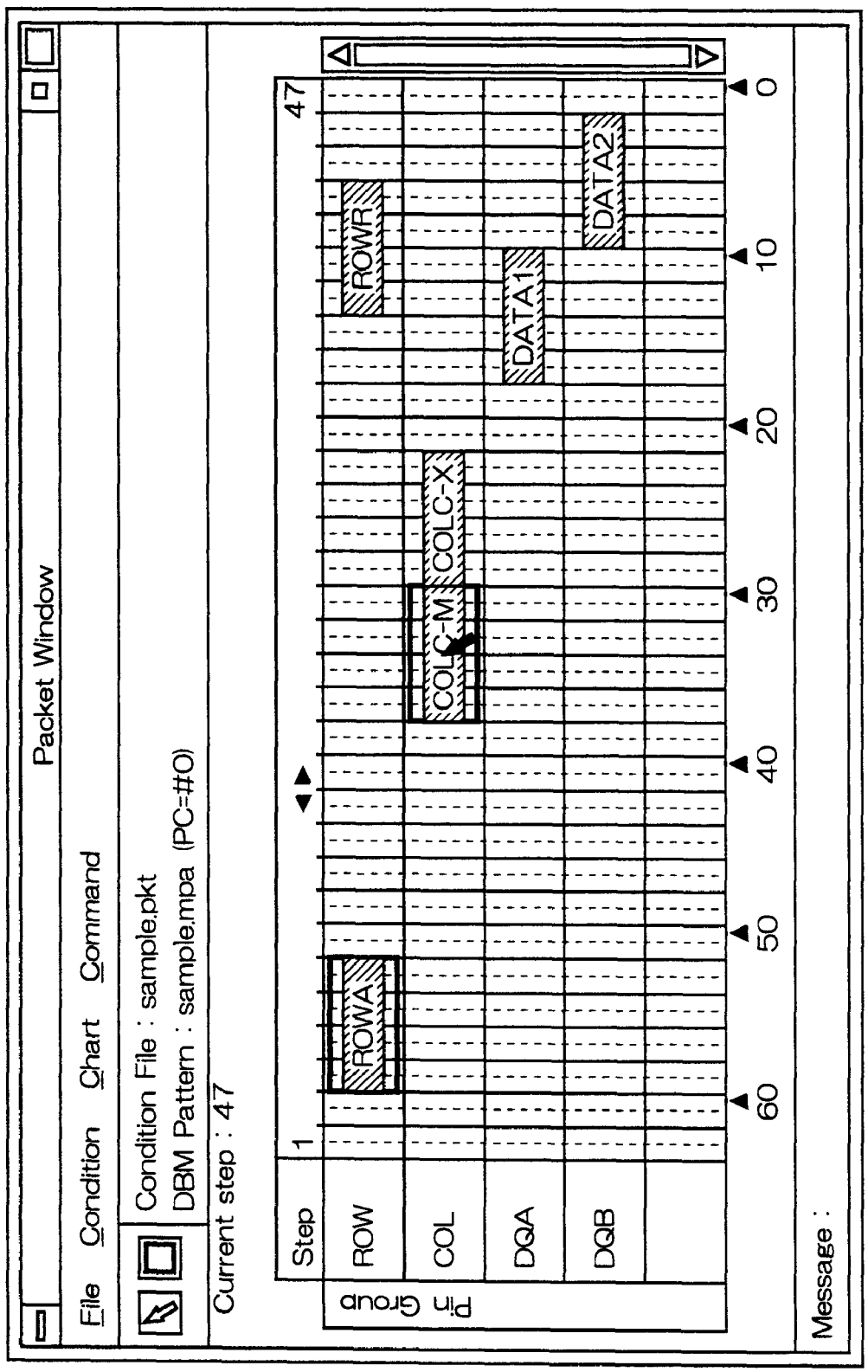
FIG. 7 shows an example of a display screen of packet window displaying a packet in the form of a timing chart image.

At step S5, the operation of the semiconductor test apparatus is simulated by the semiconductor test program debugging apparatus shown in FIG. 2 to display packets in a timing chart image as shown in FIG. 7 based on the information defined at above-mentioned steps S1 to S4. In particular, when a packet name described in a PKT instruction inserted in the pattern program as described above is defined in the Packet Define dialog, the semiconductor test program debugging apparatus extracts data output sequentially as a packet data, in synchronization with the time at which the start bit of the PKT instruction is output from a pin during simulation, and displays the extracted packet data in pin group fields in a packet chart display area as shown in FIG. 7.

FIG. 7 shows an example of a display screen of a packet window in which packets are displayed in the timing chart image. The packet window is used for displaying packets for a packet transfer memory device along the time-axis for checking the operation of a pattern program. At the top of the packet window is a title bar, on which the title "Packet Window" is displayed. At the bottom of the packet window titled "Message:" is a message display area in which warning and information messages generated during operation are displayed. A menu bar is displayed below the title bar, on which menus, "File", "Condition", "Chart", and "Command" are displayed. A pop-up menu appears when each menu is clicked with a mouse pointer.

Arrow and square icons below the menu bar are packet chart manipulation icons. The arrow icon is a "Select" button, which is a shortcut to a "Select" menu in the "Chart" menu. When this button is activated, the packet window switches to a mode of selecting a packet and moving a frame. The square icon is a "New Frame" button, which is a shortcut to a "New Frame" menu in the "Chart" menu. When this button is activated, the packet window switches to a mode of creating a new frame.

To the right of the above-mentioned packet chart manipulation icons is a condition display area for displaying conditions set in the packet window. The condition display area consists of a condition file name display area titled "Condition File:" and a DBM object file name display area titled "DBM Pattern:". A packet condition file name is displayed in the condition file name display area. A packet condition file name, "sample.pkt", is displayed in FIG. 7. The name of an object file used for the DBM and its transfer start PC (program counter) address are displayed in the DBM object file name display area. "sample.mpa (PC=#0)" is displayed as the name of the object file and its transfer start PC address in FIG. 7.

A packet chart is displayed between the packet chart manipulation icons/condition display area and the message display area at the bottom. The packet chart is a chart in which the positions of packets for each pin group are indicated by using step values of the pattern program as the horizontal axis. On the upper left of the chart is a current step indication area labeled with "Current Step:" containing the value of the current step being simulated. The step value "47" is displayed in FIG. 7. At the top of the packet chart is a step information display area labeled with "Step" in which step information is displayed. A gap mark consisting of left and right solid arrows is displayed in this step display area for indicating a part at which step values on either side are discontinuous in the packet chart. The user can recognize the position at which steps are discontinuous. On the left-hand side is a pin group name display area labeled with "Pin Group" for displaying pin group names corresponding to each row. Pin group names, "ROW", "COL", "DQA", and "DQB", are displayed from top to bottom in FIG. 7.

To the right of this pin group display area is a packet chart display area in which the positions of packets are indicated along the "step" axis. Two packets, "ROWA", "ROWR" are displayed on the row for the pin group name "ROW", two packets, "COLC-M", "COLC-X", are displayed on the row for the pin group name "COL", a packet "DATA1" is displayed on the row for the pin group name "DQA", and a packet "DATA2" is displayed on the row for the pin group name "DQB". At the bottom of the packet chart is a chart ruler display area for indicating coordinates along the axis of the horizontal axis of the packet chart display area. The origin of the chart ruler display area is at the right end and a ruler marked in ½ steps by solid lines and broken lines are displayed from this origin. If a packet starts at a pattern output in the latter half of a step at a pin at which two patterns are output in one step, the packet is aligned with a broken line of the latter half of the step.

Figure 8:
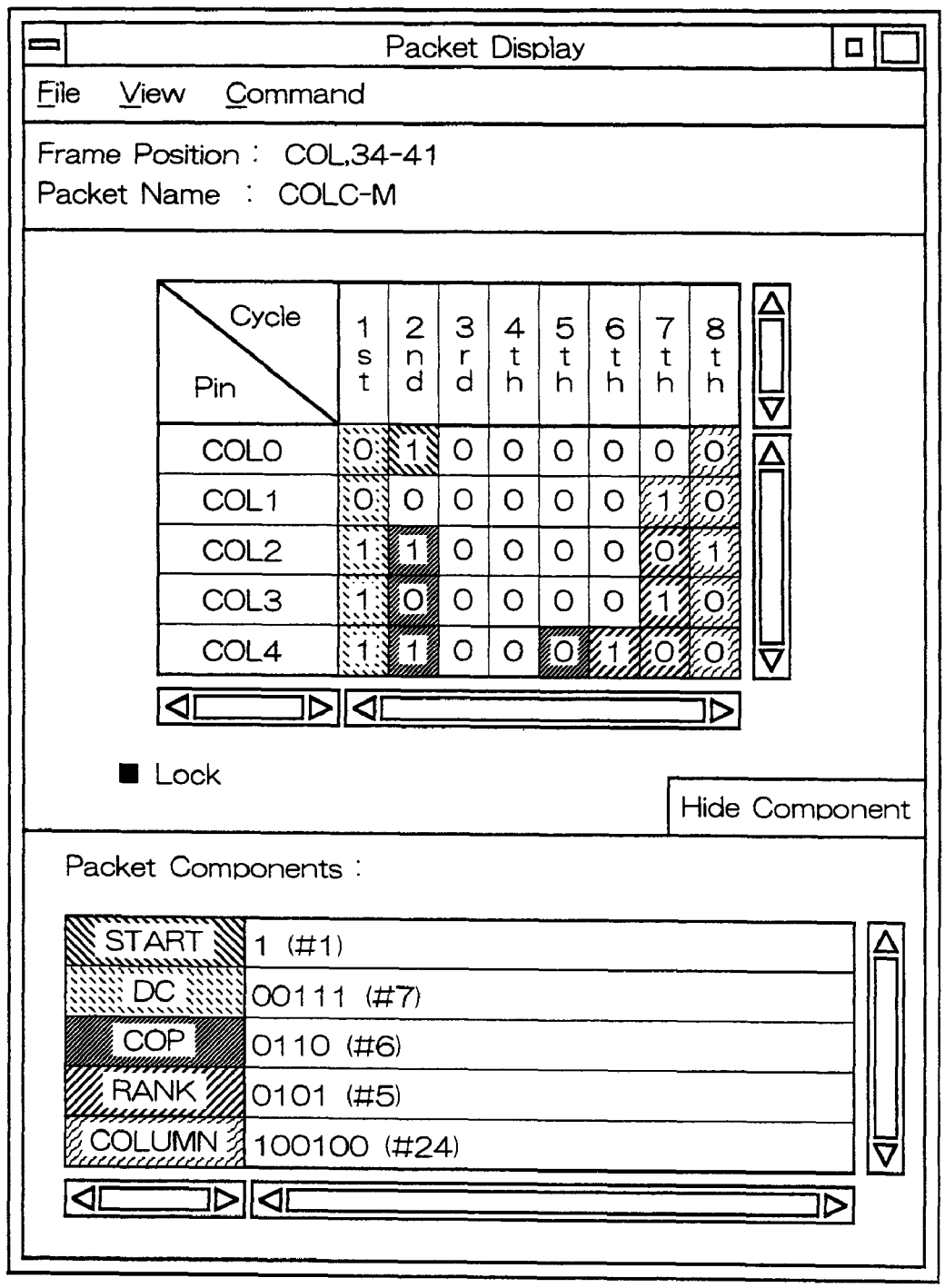
FIG. 8 shows an example of packet display window displaying in detail the content of the packet selected in the timing chart shown in FIG. 7.

At step S6, the user activates the "Select" button in FIG. 7 and selects and clicks on any packet with the mouse pointer to display a rectangular frame displayed around the packet, which entails a packet display window containing the details of the packet as shown in FIG. 8. In FIG. 7, the packet "COLC-M" is clicked with the mouse pointer while a frame is displayed around the packet "ROWA", then a frame is displayed around the packet "COLC-M".

FIG. 8 shows an example of the packet display window indicating the details of the selected packet. The packet display window is used to check the contents of a packet data generated according to a pattern program during simulating the operation of a semiconductor test apparatus with the use of the semiconductor test program debugging apparatus shown in FIG. 2, and displayed by selecting a packet shown in FIG. 7 with the mouse pointer. At the top of the packet display window is a title bar containing the title "Packet Display". Below the title bar is a menu bar containing menus, "File", "View", and "Command". Clicking on each menu with the mouse pointer displays a pop-up menu.

Below the menu bar is a frame position display area labeled with "Frame Position" and an area labeled with "Packet Name" for displaying a packet name. The position of a frame displayed in the packet window shown in FIG. 7 is indicated in the frame position display area with a pin group name and a range on the chart ruler. A pin group name "COL", which is defined in the Pin Group Define dialog shown in FIG. 5, and a range on the chart ruler, "34–41", are displayed in FIG. 8. A packet name, "COLC-M", which is defined in the Packet Define dialog shown in FIG. 6, is displayed in the packet name display area.

Below the frame position display area and the packet name display area is a packet data configuration display area and a packet component display area. The packet data configuration display area is displayed in the form of a table corresponding to the packet configuration display area "Configuration" in the Packet Define dialog shown in FIG. 6 and indicates output values during each cycle for each pin as packet data so as to corresponds to each of the packet matrix ID display areas shown in FIG. 6. The packet component display area indicates the data configuration of each component defined in the component setting display area "Components" in the Packet Define dialog shown in FIG. 6. The packet component display area consists of a component name display area and a component data display area. Each field of the component name display area is displayed in a different color and data in each packet data configuration area corresponding to each component is displayed in the same color as the component name. That is, the component name "START" and the data of the corresponding matrix ID "6" (data in the second cycle "2nd" on the pin name "COL0" row) are displayed in the same color. Similarly, data of the matrix IDs "1–5", "25, 10, 8, 9", "33–35, 30", and "32, 36–40" is displayed in the same color as that of the respective corresponding component names "DC", "COP", "BANK", and "COLUMN". In FIG. 8, the color distinction is indicated by using different types of crosshatch instead of colors.

Matrix ID data corresponding to the components is displayed in the component data display area both in bits and in hexadecimal. Data in bits is indicated with a combination of "0", "1", "L", "H", and "X" and "#" is added to the beginning of hexadecimal data. If bit data contains "X", its hexadecimal notations are omitted. In FIG. 8, the data of the component "START" is indicated as "1 (#1)", "DC" as "00111 (#7)", "COP" as "0110 (#6)", "BANK" as "0101 (#5)", and "COLUMN" as "100100 (#24).

At the bottom left of the packet data configuration display area is a display rock button labeled with "Lock". The display rock button avoids renewing the display of a packet data display area and a component display area. In addition, at the bottom right of a packet data configuration display area is a component display control button labeled with "Hide Component". The component display control button is used to specify whether the components are to be displayed or not on the Packet Display window. When the components are not displayed on the window, the component display button is labeled with "Show Component".

As described above, according to the embodiment, packet configuration for a packet transfer memory device is defined according to a predetermined format by the process from step S1 to step S3 and the start position of the packet is specified in a pattern program at step S4, thereby allowing the packet to be displayed in a timing chart image at step S5 and packet data to be easily identified among data continuously output at step S6. Thus a semiconductor test program for a semiconductor device such as the packet transfer memory device which operates based on packet data can be easily debugged.

The above-described simulator controller 110 and the tester simulator 140 correspond to tester simulate unit, the packet display function processor 150, the display 160, the mouse 162, and the keyboard 154 which implement the operations from step S1 to step S4 correspond to data supply unit, and the packet display function processor 150, the display 160, the mouse 162, and the keyboard 154 which implement the operations steps S5, S6 correspond to packet extraction display unit.

The present invention is not limited to the embodiment described above. Many variations may be made within the scope of the present invention. For example, while in the embodiment described above the case where the packet configuration of the packet transfer memory device is defined by the user, a file in which the packet configuration for each packet transfer memory device is provided beforehand and the packet configuration for a relevant packet transfer memory device may be read from the file.

As described above, it is advantageous that according to the present invention a semiconductor test program for a semiconductor device which operates based on packet data, such as a packet transfer memory device, can be easily debugged.

We claim:

1. A semiconductor test program debugging apparatus, comprising:

tester simulation unit for simulating the operation of a semiconductor test apparatus by generating a test signal in a simulative manner based on a test program provided for a packet transfer memory device;

data supply unit for supplying data concerning a packet input to and output from said packet transfer memory device; and packet extraction and display unit for, based on said data supplied by said data supply unit, extracting a part corresponding to said packet from said test signal generated by said tester simulation unit and displaying the content thereof.

2. The semiconductor test program debugging apparatus according to claim 1, wherein said data supply unit supplies information about the predefined pin conditions of said packet transfer memory device, a pin group making up the packet, the configuration of said packet, and the starting position of said packet as the data concerning to said packet.

3. The semiconductor test program debugging apparatus according to claim 2, wherein said data supply unit accepts various inputs through a GUI screen to generate the data concerning said packet.

4. The semiconductor test program debugging apparatus according to claim 1, wherein said packet extraction and display unit displays the part corresponding to said packet in a timing chart image using step values of the simulation operation by said tester simulation unit for the time axis.

5. The semiconductor test program debugging apparatus according to claim 4, wherein said packet extraction and display unit displays output values during each cycle for each pin in a way that components contained in said packet can easily be identified, when instructed to display details of the part corresponding to said packet displayed in said timing chart image.

6. The semiconductor test program debugging apparatus according to claim 5, wherein said packet extraction and display unit displays a packet component display area in which the data configuration of each of said components is displayed in the same display screen as the packet data configuration area in which said output values are displayed.

* * * * *